(12) United States Patent
Yamauchi et al.

(10) Patent No.: US 7,186,598 B2
(45) Date of Patent: Mar. 6, 2007

(54) SEMICONDUCTOR DEVICE AND MANUFACTURING METHOD OF THE SAME

(75) Inventors: Jun Yamauchi, Kawasaki (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/103,470

(22) Filed: Apr. 12, 2005

(65) Prior Publication Data

US 2005/0181585 A1 Aug. 18, 2005

Related U.S. Application Data

(62) Division of application No. 10/609,392, filed on Jul. 1, 2003, now Pat. No. 6,930,360.

(30) Foreign Application Priority Data

Sep. 24, 2002 (JP) ............................. 2002-278088

(51) Int. Cl.
*H01L 21/00* (2006.01)
*H01L 29/76* (2006.01)

(52) U.S. Cl. ...................................... 438/151; 257/368

(58) Field of Classification Search ........ 257/368–370, 257/520, 521; 438/519, 527, 532–534
See application file for complete search history.

(56) References Cited

U.S. PATENT DOCUMENTS 5,668,397 A 9/1997 Davis et al.

FOREIGN PATENT DOCUMENTS

| JP | 55-25492 | 7/1980 |
|----|----------|--------|
| JP | 55-28215 | 7/1980 |
| JP | 2002-76332 | 3/2002 |
| JP | 2002-368212 | 12/2002 |
| JP | 3642157 | 2/2005 |
| KR | 1998-087334 | 12/1998 |

OTHER PUBLICATIONS

Jun Yamauchi, et al., "First-Principles Study on Indium atoms in Silicon", 26th International Conference on Physics of Semiconductors Abstract, Jul. 29, 2002, p. 115.

*Primary Examiner*—Calvin Lee
(74) *Attorney, Agent, or Firm*—Oblon, Spivak, McClelland, Maier & Neustadt, P.C.

(57) ABSTRACT

A semiconductor device having a semiconductor layer, includes: a first impurity atom having a covalent bond radius larger than a minimum radius of a covalent bond of a semiconductor constituent atom of a semiconductor layer; and a second impurity atom having a covalent bond radius smaller than a maximum radius of the covalent bond of the semiconductor constituent atom; wherein the first and second impurity atoms are arranged in a nearest neighbor lattice site location and at least one of the first and second impurity atoms is electrically active.

7 Claims, 6 Drawing Sheets

SEMICONDUCTOR DEVICE AND MANUFACTURING METHOD OF THE SAME

CROSS-REFERENCE TO RELATED APPLICATION

The present application is Divisional of U.S. application Ser. No. 10/609,392, filed on Jul. 1, 2003 and issued as U.S. Pat. No. 6,930,360 and in turn claims priority to Japanese Patent Application P2002-278088 filed on Sep. 24, 2002; the entire contents of both of which are incorporated by reference herein.

BACKGROUND OF THE INVENTION

1. Field of the Invention

The present invention relates to a semiconductor device and a manufacturing method for the same. In particular, it relates to a semiconductor device using a semiconductor layer doped with impurity atoms having different covalent bond radii.

2. Description of the Related Art

Control of an impurity distribution in a semiconductor layer is extremely important for a semiconductor device. Generally, a thermal diffusion process is used as a technique to form an impurity distribution in a semiconductor layer with high controllability. However, depending on a doping impurity atom, an insufficient concentration of an electrically active impurity atom is provided. Alternatively, the desired impurity distribution is not provided which results in a large diffusion coefficient of the impurity atom. For example, in order to suppress a short channel effect and achieve a high drive current in a metal-oxide-semiconductor field effect transistor (MOSFET) fabricated on a semiconductor substrate such as silicon (Si), it is necessary to form a super steep retrograde channel profile (SSRP), where impurity concentration decreases rapidly toward a gate oxide layer in a channel region of the MOSFET. Otherwise, in a source/drain region, it is required to form a shallow impurity diffusion layer with low resistance.

Indium (In) is used as an acceptor impurity atom in order to form the SSRP of an n-channel MOSFET. However, it is difficult to form a high carrier concentration in a deep channel region because of a low active impurity concentration of In. In addition, in a source/drain region of a p-channel MOSFET, boron (B) is used as an acceptor impurity atom. However, it is very difficult to form a shallow impurity diffusion layer so that a diffusion coefficient of B in a Si crystal is large. Further, because of the low active impurity concentration, In cannot be used as an acceptor impurity atom of the source/drain region of the p-channel MOSFET.

Many proposals for a technique such as "co-doping" which dopes plural impurity atoms together in a semiconductor layer, have been disclosed. According to the co-doping technique, in order to reduce the crystal defect in a semiconductor layer by a vapor phase growth, a method in which phosphorus (P) and arsenic (As) are doped together in a Si layer has been reported (see Japanese Patent Application Nos. 55-028215 and 55-025492). However, a carrier concentration cannot exceed the active impurity concentration of P and As. In addition, in order to suppress diffusion of an acceptor atom, a method to co-dope a constituent semiconductor atom in addition to the acceptor atom has been reported (see Japanese Patent Laid-Open No. 2000-68225). In addition, when doping B into the Si layer, a method to co-dope germanium (Ge) is used. However, it is necessary to dope Ge with a high concentration to change the activation rate and the diffusion for. B.

As described above, in a semiconductor device such as the MOSFET, the doping layer of the high impurity concentration is needed in the channel or the source/drain region. However, it is impossible to achieve a higher carrier concentration exceeding the active impurity concentration of the dopant atom. It is also impossible to suppress the diffusion of the heavily doped impurity atom.

SUMMARY OF THE INVENTION

An object of the present invention is to provide a semiconductor device having a doping layer so as to improve an activation rate of an impurity atom and to suppress diffusion of the impurity atom.

A first aspect of the present invention inheres in a semiconductor device having a semiconductor layer including a first impurity atom having a covalent bond radius larger than a minimum radius of a covalent bond of a semiconductor constituent atom of a semiconductor layer, and a second impurity atom having a covalent bond radius smaller than a maximum radius of the covalent bond of the semiconductor constituent atom, wherein the first and second impurity atoms are arranged in a nearest neighbor lattice site location and at least one of the first and second impurity atoms is electrically active.

A second aspect of the present invention inheres in a manufacturing method of a semiconductor device including providing a semiconductor substrate, doping a first impurity atom having a covalent bond radius larger than a minimum radius of a covalent bond of a semiconductor constituent atom of a semiconductor layer of the semiconductor substrate, and doping a second impurity atom having a covalent bond radius smaller than a maximum radius of a covalent bond of the semiconductor constituent atom so as to be arranged in a nearest neighbor lattice site of the first impurity atom.

DETAILED DESCRIPTION OF THE INVENTION

Figure 1:
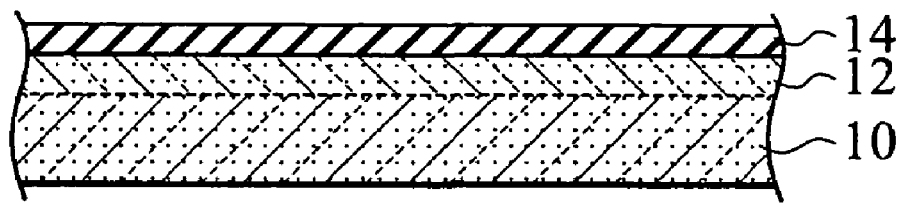
FIG. 1 is a cross-sectional view showing an example of a semiconductor layer of a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

A semiconductor device according to an embodiment of the present invention includes, as shown in FIG. 1, a semiconductor layer 12 doped with first and second impurity atoms by a nearest neighbor lattice site location in a principal surface side of a semiconductor substrate 10. On the semiconductor layer 12, for example, an insulating film 14 such as a gate oxide film of the semiconductor device is deposited. For example, a covalent bond radius of the first impurity atom is larger than the minimum of a covalent bond radius of a constituent atom of the semiconductor layer 12, and a covalent bond radius of the second impurity atom is smaller than the maximum of the covalent bond radius of the constituent atom of the semiconductor layer 12. At least one of the first and second impurity atoms is an acceptor or a donor impurity atom.

Figure 2:
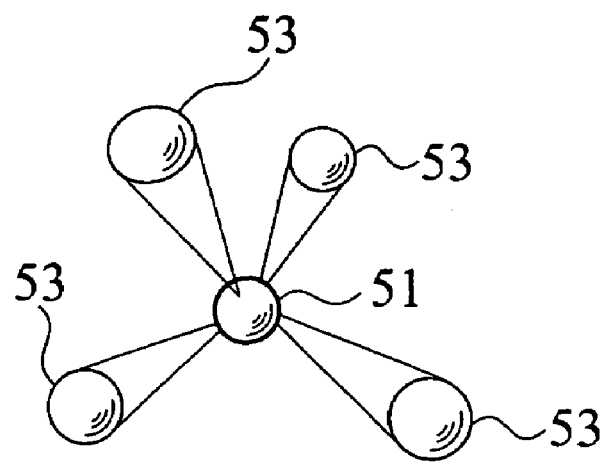
FIG. 2 is a figure showing an electronic state of a semiconductor by the tight-binding approximation description according to an embodiment of the present invention.
Figure 3:
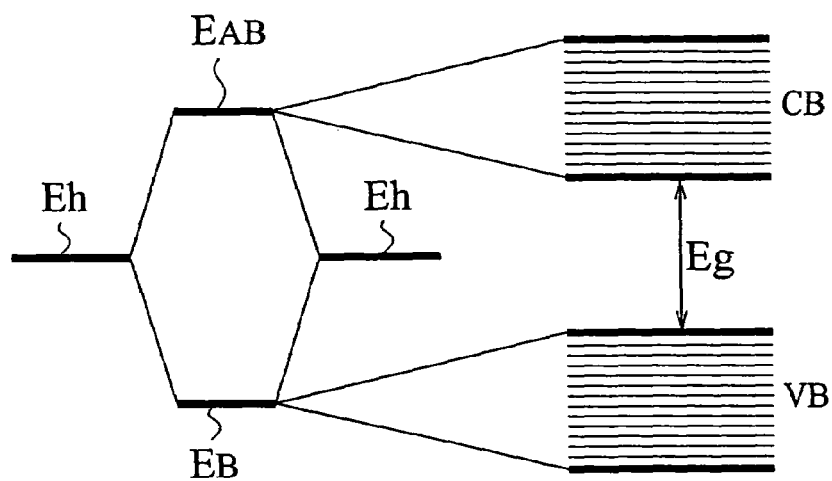
FIG. 3 is a figure showing bonding states of electronic orbital of Si by the tight-binding approximation description according to the embodiment of the present invention.

At first a base model of the embodiment of the present invention is explained by using FIG. 2 through FIG. 6. By simulating an electron bonding orbital using the tight-binding approximation in a semiconductor having a tetrahedral arrangement such as diamond (C), silicon (Si), germanium (Ge), a column III-V compound semiconductor and a column II-VI compound semiconductor, a semiconductor atom 51 arranges an $sp^3$ hybridized orbital 53, as shown in FIG. 2. When the semiconductor atom 51 assumes a molecule state from an independent atomic state, as shown in FIG. 3, the $sp^3$ hybridized orbital 53 of a orbital energy level Eh of the independent atomic state is separated into a bonding orbital of a bonding energy level $E_B$ between adjacent semiconductor atoms 51 and an anti-bonding orbital of an anti-bonding energy level $E_{AB}$. Furthermore, when the molecule state is changed to a crystal state, the bonding orbital and the anti-bonding orbital are expanded to form a valence band VB and a conduction band CB having a band gap energy Eg.

An electron configuration where two impurity atoms serving as the acceptor or the donor, producing a comparatively deep impurity level in the gap are arranged in a nearest neighbor substitutional site is considered. As an operative example to simplify explanation, In and B which are acceptors in a column IV element semiconductor such as Si are described. However, other acceptor impurity atoms may be used. In addition, similar considerations are appropriate in the case of a donor by replacing an electron with a hole. Furthermore, similar considerations are appropriate for other semiconductors including a compound semiconductor.

Figure 4A:
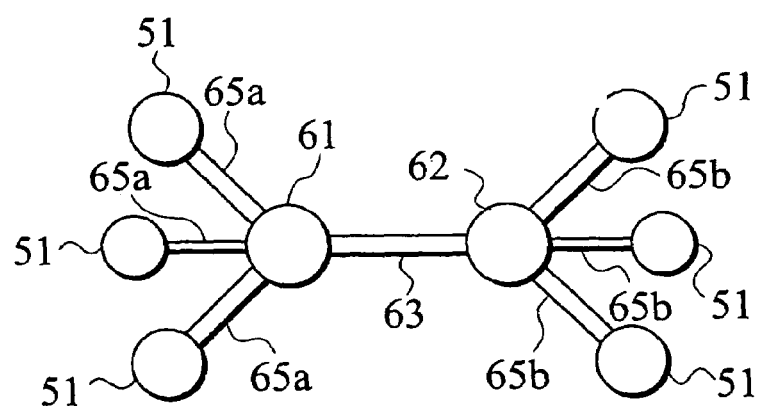
FIGS. 4A and 4B are schematic diagrams explaining bonding states of nearest neighbor impurity atoms in a semiconductor according to the embodiment of the present invention.
Figure 4B:
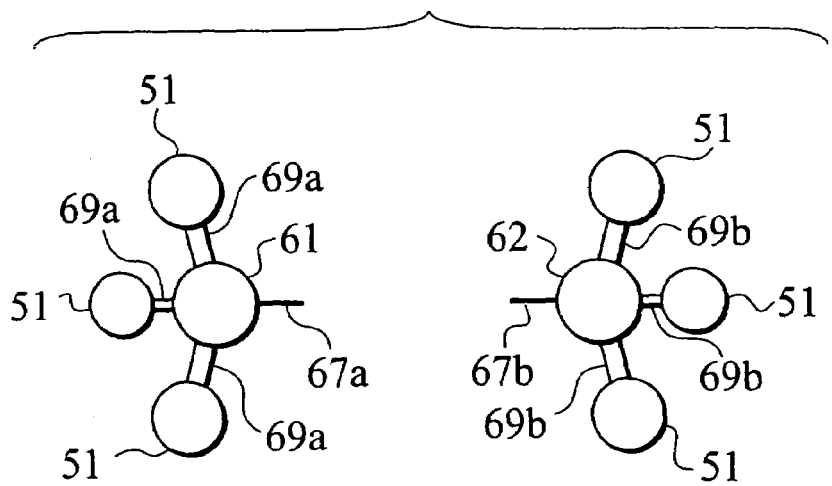

As shown in FIGS. 4A and 4B, when a first impurity atom 61 and a second impurity atom 62 are arranged in a nearest neighbor substitutional site, two configurations can be considered. One is, as shown in FIG. 4A, a configuration of a bonding orbital 63 between the first impurity atoms 61 and the second impurity atoms 62 which is like the $sp^3$ hybridized orbital, as well as bonding orbitals 65a or 65b between the semiconductor atom 51 and the first impurity atom 61 or the second impurity atom 62. The configuration shown in FIG. 4A is defined as "an $sp^3$ configuration". The other is, as shown in FIG. 4B, a configuration where bonding between the first impurity atom 61 and the second impurity atom 62 is broken so as to separate the impurity atoms from each other and to move respectively toward the semiconductor atom 51. The bonding orbitals 69a or 69b between the semiconductor atom 51 and the first impurity atom 61 or the second impurity atom 62, are like a planar $sp^2$ hybridized orbital as similar to graphite. The broken bonding orbitals 67a, 67b of the first and second impurity atoms 61, 62 serve as p orbitals, respectively. The configuration shown in FIG. 4(b) is defined as "an $sp^2$ configuration".

Figure 5A:
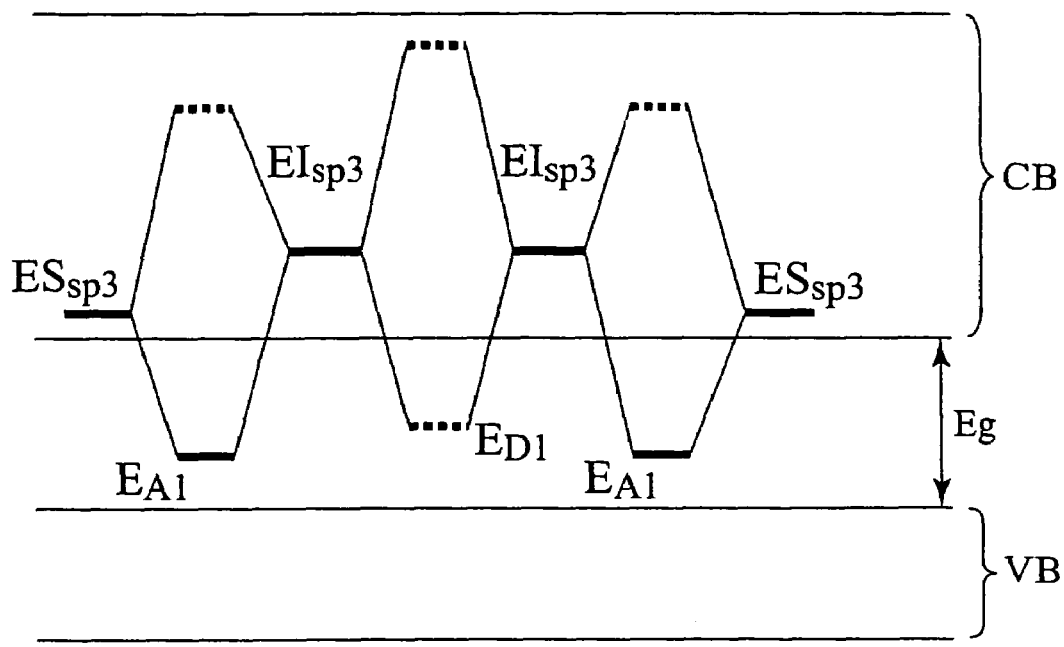
FIGS. 5A and 5B are schematic diagrams showing energy levels of bonding states of a cluster between the same impurity atoms in a semiconductor according to the embodiment of the present invention.
Figure 5B:
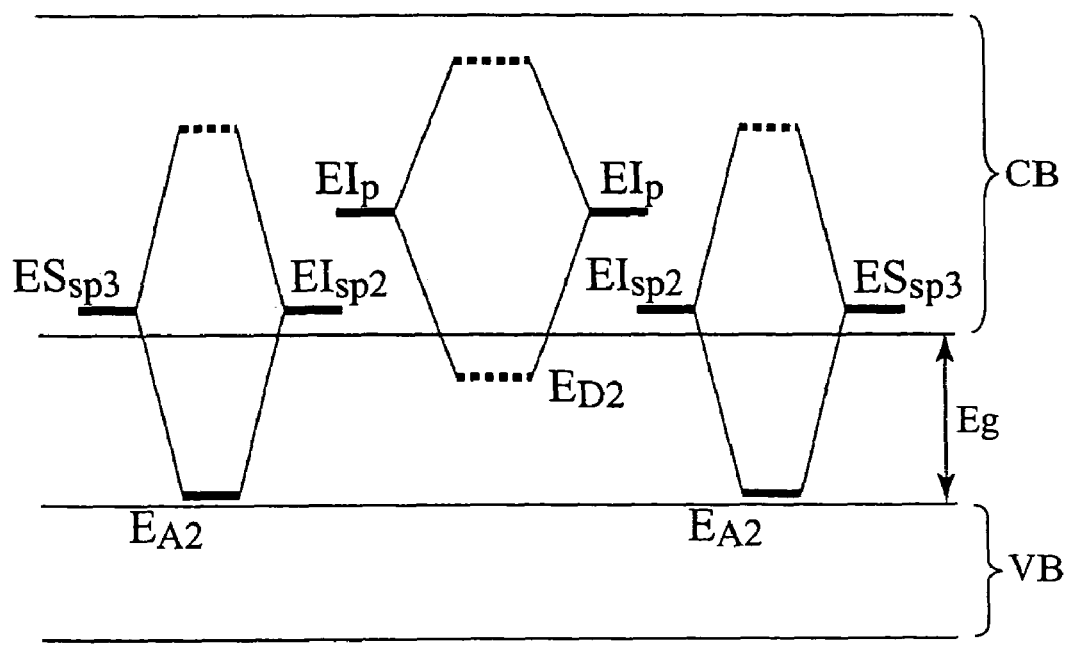

To begin with, the case where the first and the second impurity atoms 61, 62 are the same impurity atom, In, is described by use of FIGS. 5A and 5B. Energy levels of the bonding orbitals of In—Si or In—In located between the valence band VB and the conduction band CB, which are separated by the band gap energy Eg, are determined by deduction. FIG. 5A shows the energy level of the bonding orbitals when In provides the $sp^3$ configuration. All four In $sp^3$ hybridized orbitals have the same energy level $EI_{sp3}$. The In—Si bonding orbitals provided by the hybridized orbitals with three Si atoms adjacent to the In atom, form the acceptor level $E_{A1}$ at a comparatively shallow position near the upper end of the valence band VB, as is the case where the In atom is alone in a substitutional site. On the other hand, the energy level $EI_{sp3}$ of the In $sp^3$ hybridized orbital is higher than the energy level $ES_{sp3}$ of the Si $sp^3$ hybridized orbital.

Therefore, the energy level of the In—In bonding orbital for the nearest neighbor substitutional site is slightly higher than the acceptor level $E_{A1}$ of the In—Si bonding orbital, and forms a deep acceptor level $E_{D1}$. In addition, because the In atom is tervalent, an electron does not provide for the deep acceptor level $E_{D1}$.

FIG. 5B shows the energy level of the bonding orbital when In provides the $sp^2$ configuration. The In orbitals are, as shown in FIG. 4B, of three planar $sp^2$ hybridized orbitals spreading in three directions and the p orbital. In comparison with the energy level $EI_{sp3}$ of the In $sp^3$ hybridized orbital, the energy level $EI_{sp2}$ of the $sp^2$ hybridized orbital is low, and the energy level $EI_p$ of the p orbital is high. Therefore, the acceptor level $E_{A2}$ of the In—Si bonding orbital of the $sp^2$ configuration is lower than the acceptor level $E_{A1}$ of the $sp^3$ configuration. On the contrary, the acceptor level $E_{D2}$ of the p orbital of the $sp^2$ configuration is higher than the deep acceptor level $E_{D1}$ of the In—In bonding orbital. Then the acceptor level $ED_2$ is formed at a position near conduction band CB from the center of the band gap. Since the p orbital is empty, i.e., the In—In bond is broken, electronic orbital energy of the $sp^2$ configuration completely decreases, as compared with the $sp^3$ configuration. The decreased energy difference is defined as an energy gain $\Delta\epsilon$ by the $sp^2$ configuring.

As described above, the electronic energy of the bonding orbital near the upper end of the valence band VB decreases by shifting from the $sp^3$ configuration to the $sp^2$ configuration. Practically, an elastic potential energy increases with increment $\Delta Es$, since the lattice is distorted by shifting from the sp3 configuration to the $sp^2$ configuration. Depending on the magnitude relation between the energy gain $\Delta\epsilon$ by $sp^2$ configuring and the elastic potential energy increment $\Delta Es$, the bonding orbital under consideration is provided either the $sp^3$ configuration or the $sp^2$ configuration. When the acceptor level $E_{A1}$ is deeper, the energy gain $\Delta\epsilon$ by $sp^2$ configuring increases and the $sp^2$ configuration easily tends to be formed. A great difference occurs in a function as a dopant in the sp² configuration and the sp³ configuration. In other words, in the sp³ configuration, the In—In bonding orbital is basically electrically active although energy increases. On the other hand, in the sp² configuration, the bonding orbital is electrically inactive because of the large energy increase of the bonding orbital.

The In atom has a large covalent bond radius in comparison with Si. Generally, when the impurity atom that has a different covalent bond radius from Si comes close to the same impurity atom, the elastic potential energy increases due to the lattice distortion. Therefore, total energy of the bonding orbital increases. However, when the energy gain $\Delta\epsilon$ by sp² configuring is large enough, the elastic potential energy $\Delta$Es is overcome and an In—In cluster is formed. In addition, when the acceptor level of the lone impurity atom is deep, energy gain increases by filling two electrons in the bonding orbital between the acceptor levels of the impurity atom. Therefore, an attraction force between the impurity atoms has an effect that the impurity cluster become stable.

The foregoing deduction is based on use of a simple model.

According to the detailed first principle calculation by use of the generalized gradient approximation based on the density functional method, the formation energy of the In—In bond is 0.6 eV lower than the energy for the In atom in an isolated state. Energy of a configuration for the two In atoms in the substitutional sites also increases along with distance between the two In atoms. In other words, the attraction force tends to provide an effect between the two In atoms. In addition, the In—In bond is electrically inactive and the empty deep level deduced by the above-discussed model of the tight-binding approximation appears in the energy gap. On the contrary, for the B atom, the covalent bond radius is smaller than the Si atom. In the case of B, the energy of the B—B bond in the nearest neighbor substitutional site is 0.6 eV higher than the energy for the B atom in an isolated state. In other words, a repulsive force provided an effect between the two B atoms in the nearest neighbor substitutional sites. Furthermore, the B—B bond of the nearest neighbor substitutional sites is electrically active.

The energy gain $\Delta\epsilon$ by sp² configuring is small in the case of an element such as B having a high electrical activation rate as a dopant. Therefore, the B atoms tend to move away from each other due to the increase of the elastic potential energy. In addition, when the two B atoms are disposed in the nearest neighbor substitutional sites, the B atoms are still electrically active. On the other hand, in the case of a dopant such as In where the energy gain $\Delta\epsilon$ by sp² configuring is large, it is easy for the dopant atoms to come close to each other. In addition, the dopant atoms residing in the nearest neighbor substitutional site are electrically inactive. In other words, In is a dopant which easy to cohere and to be inactive.

Here, the solid solubility limit is considered. The solid solubility limit is defined as the concentration where impurity atoms in the crystal cannot reside in substitutional sites of the crystal lattice so as to cohere and precipitate. Because the precipitation at the beginning concentration of cohesion cannot be observed in an electron microscopes, the solid solubility limit is determined at the upper limit of the carrier concentration in the case of an electrically active dopant. However, in the case of an impurity atom subjected to the sp² configuring mechanism, even though the carrier concentration reaches and saturates at the upper limit, the impurity atoms are mainly in the substitutional sites without cohering.

It is conceivable that the combination of the In—In bond is replaced in other combination with impurity atoms of In and another kind in order to promote activation of a dopant in an inactive state. A case where In as the first impurity atom 61 and B as the second, different impurity atom 62 shown in FIG. 4, is described using FIGS. 6A and 6B.

Figure 6A:
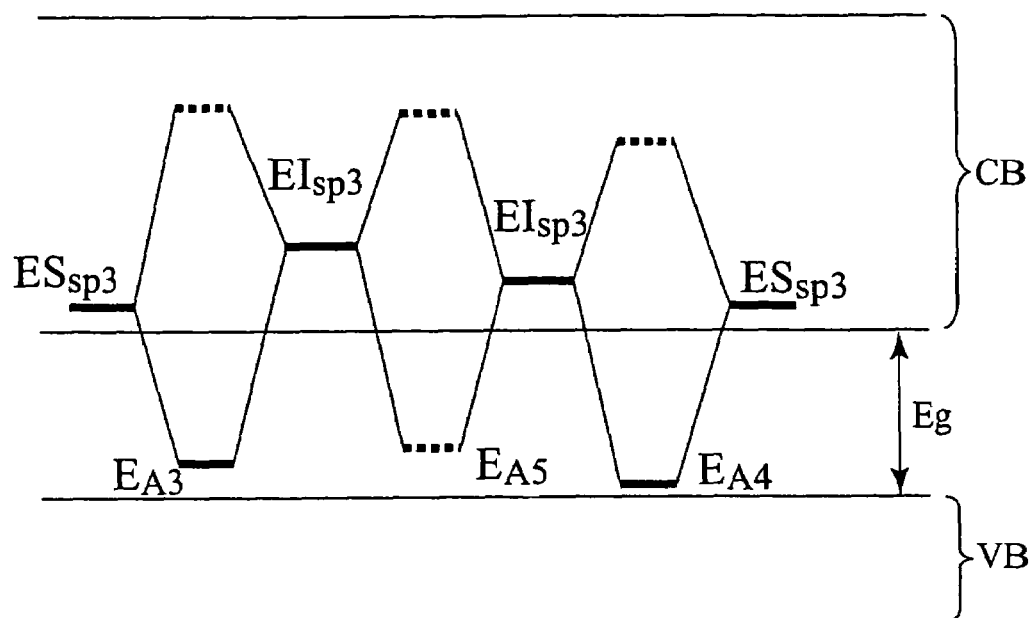
FIGS. 6A and 6B are schematic diagrams showing energy levels of bonding states of a cluster between the first and second impurity atoms in a semiconductor according to the embodiment of the present invention.

As shown in FIG. 6A, the case where the first and the second impurity atoms 61, 62 provide the sp³ configuration in the nearest neighbor substitutional site is considered. Here, the energy level $EI_{sp3}$ of the sp³ hybridized orbital of the second impurity atom 62 is lower than the energy level $EI_{sp3}$ of the sp³ hybridized orbital of the first impurity atom 61, and slightly higher than the energy level $ES_{sp3}$ of the sp³ hybridized orbital of the semiconductor atom 51. The first impurity atom 61 and the semiconductor atom 51 produce the acceptor level $E_{A3}$. The second impurity atom 62 and the semiconductor atom 51 produce the acceptor level $E_{A4}$. In addition, the first and the second impurity atoms 61, 62 produce the acceptor level $E_{A5}$. The acceptor level $E_{A4}$ is slightly shallow in comparison with the acceptor level $E_{A3}$. In addition, the acceptor level $E_{A5}$ produced by the first and the second impurity atoms is deeper than the acceptor levels $E_{A3}$ and $E_{A4}$. In other words, in order to be suitable in terms of energy for sp³ configuring when the second impurity atom 62 is arranged in the nearest neighbor substitutional site of the first impurity atoms 61, the acceptor level $E_{A4}$ which is the energy level of the electronic state produced by the second impurity atom 62 in the substitutional site of the semiconductor crystal, is shallower than the acceptor level $E_{A3}$ Of the first impurity atoms 61.

Figure 6B:
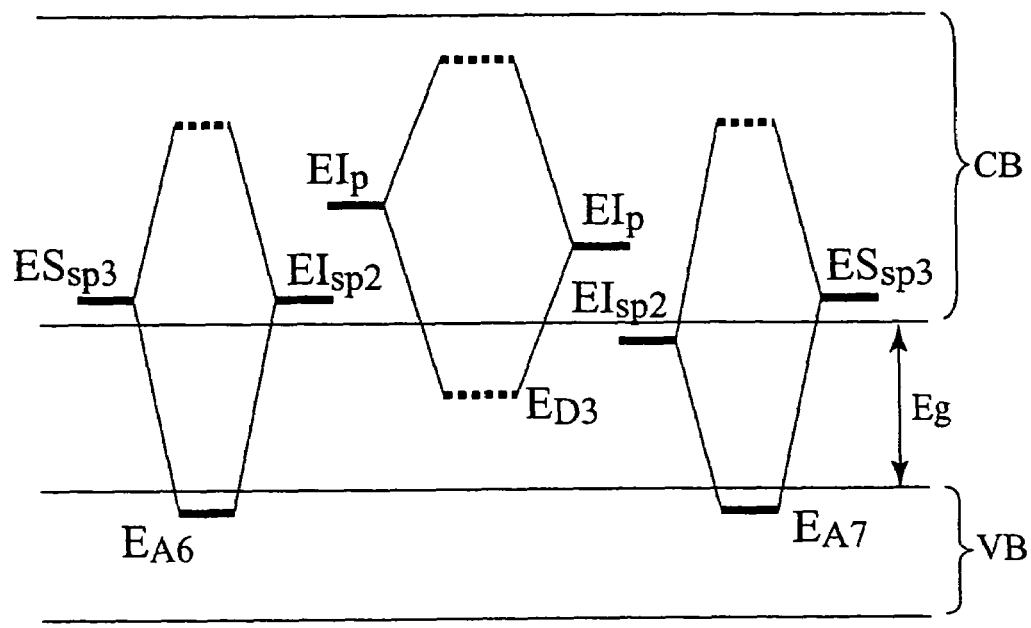

On the other hand, as shown in FIG. 6B, when the first and the second impurity atoms 61, 62 provide the sp² configuration in the nearest neighbor substitutional site, the energy levels $EI_{sp2}$ of the sp² hybridized orbital are low, and the energy level $EI_p$ of the p orbital is high in comparison with the energy level $EI_{sp3}$ of the sp³ hybridized orbital. Here the energy levels $EI_{sp2}$ and $EI_p$ for the first impurity atom 61 are high in comparison with the second impurity atom 62. Then, acceptor levels $E_{A6}$ and $E_{A7}$ introduced by the combination of the semiconductor atom 51 and the first or the second impurity atoms 61, 62 are produced in the valence band. An acceptor level $E_{D3}$ introduced by the combination of the first and the second impurity atoms 61, 62 is inactive and produced in a deep level near the middle of the band gap.

The electron configuration of the impurity atoms becomes either the sp³ configuration or the sp² configuration depending on magnitude relation between the energy gain $\Delta\epsilon$ by the sp² configuring and the elastic potential energy gain $\Delta$Es. Therefore, it is necessary to make the sp³ configuration which provides the electrically active acceptor level advantageous in terms of energy by reducing the energy gain $\Delta\epsilon$ provided by the sp² configuring.

Impurity atoms corresponding to such a condition are B and carbon(C) for In in a Si crystal. The covalent bond radii of In, B and C are 0.144 nm, 0.088 nm and 0.077 nm, respectively, with relation to Si radius of 0.117 nm. A combination of In and B or In and C provides stress relaxation of the elastic potential energy. In addition, the acceptor levels of In and B are 155 meV and 45 meV, respectively, and B has a shallow acceptor level in comparison with In.

Furthermore, C which is a congener element of Si, does not produce the donor or acceptor levels in the substitutional site in the Si crystal. Thus, the energy level of C can be assumed as 0 or a minus value, and satisfies the condition in which the sp³ configuration becomes advantageous. Actually, according to the result of the first principle calculation, total energies of an In—B cluster and an In—C cluster are 0.6 eV and 0.8 eV, respectively, which are lower than an isolated state of In, B and In, C.

In addition, the In—B bonding and the In—C bonding orbitals are electrically activated. In the case of B, when two B atoms in the substitutional sites and the inactive In—In clusters reside, it is suggested that two active In—B clusters may be formed so as to be stable for approximately 0.6 eV in terms of energy. By the above-mentioned fact, the In—B cluster improves the electrical activation rate. Additionally because of a decrease of energy by the cluster formation, diffusion of the impurity atoms may be suppressed.

In other words, by doping In and B with a ratio of 1:1 in a concentration region over the solid solubility limit of In, improvement of the activation rate and control of the diffusion profile are possible. This is due to that, in case of the In—C cluster, C does not introduce an acceptor level, and a carrier concentration is half in comparison with B. However, In—C may provide a similar effect as that of the In—B cluster.

The above explanation is an example of a column IV element semiconductor, but the dopant control based on a similar mechanism for a column III-V or a column II-VI compound semiconductor may be possible. In the case of a compound semiconductor, it is necessary to take into account the substitutional sites substituted by a dopant. For example, in the column III-V compound semiconductor, when a group II atom substitutes for a lattice site location of the group III atom, or a group IV atom substitutes for the lattice site location of the group V atom, both the group II atom and group IV atom work as acceptors. In addition, when the group IV atom substitutes for the group III lattice site location, or the group VI atom substitutes for the group V lattice site location, both the group IV atom and group VI atom work as donors. Similarly in the column II-VI compound semiconductor, dopants of plural groups can be used as the acceptors or the donors. In addition, in the column II-VI compound semiconductor, it is substantially different from the column III-V compound semiconductor in that a vacancy has to consider as a dopant. The vacancy works as the acceptor when introduced in the group II lattice site location, and as the donor when introduced in the group VI lattice site location.

Next, a description is made of a method to dope the In and B atoms as the first and the second impurity atoms 61, 62 in a semiconductor substrate 10 such as an Si substrate, with respect to the semiconductor device shown in FIG. 1.

At first, on a surface of the semiconductor substrate 10, an insulating film 14 is formed with a thickness of 5 nm by a thermal oxidation method. Through the insulating film 14, ions of In are implanted. Ion implantation conditions are an acceleration energy of 50 keV, and a dose of $1.5*10^{13}$ cm$^{-2}$. Ions of B is implanted afterwards. Ion implantation conditions are an acceleration energy of 7 keV, and a dose of $4*10^{13}$ cm$^{-2}$. Then, a heat treatment is performed after the ion implantations.

In this way, a semiconductor layer 12 having the electrically activated implanted impurity atoms is formed in the surface of the semiconductor substrate 10.

Figure 7:
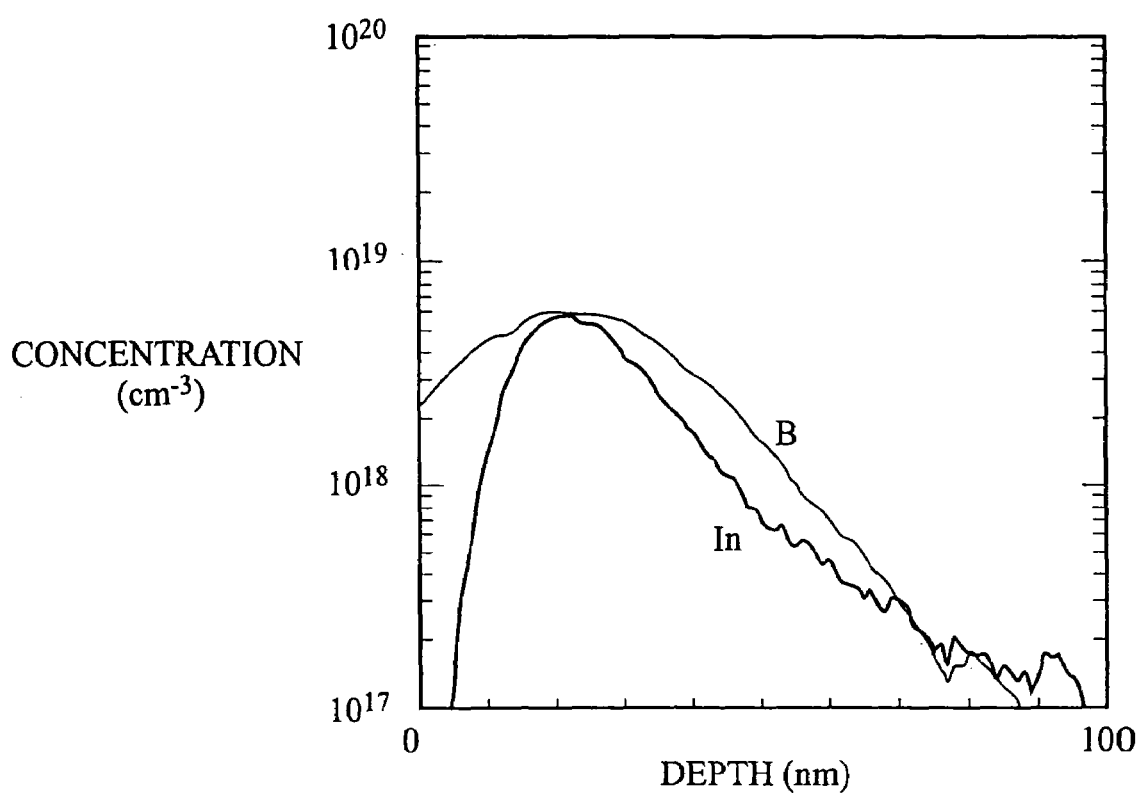
FIG. 7 is a figure showing an example of impurity distributions in a semiconductor layer according to an embodiment of the present invention.

The ions have been implanted, as shown in FIG. 7, so as to have approximately the same peak density of the In and B impurity atoms in the semiconductor substrate 10. The solid solubility limit of In is $1.5*10^{18}$ cm$^{-3}$ at 800–1100° C. However, by interacting with B, the active In concentration of approximately $6*10^{18}$ cm$^{-3}$ corresponding to the peak ion-implanted concentration of B can be achieved. Therefore, a total amount of the active impurity concentration near the region of the peak ion-implanted concentration of approximately $1*10^{19}$ cm$^{-3}$ can be achieved. Therefore, effect of the activation rate by interaction of In and B applied to a channel region of a MOSFET can be improved.

For example, as shown in FIG. 7, the channel region having the steep concentration distribution so as to have a low impurity concentration of approximately $2*10^{18}$ cm$^{-3}$ at the surface portion of the semiconductor substrate 10, and to have an active impurity concentration of more than $1*10^{19}$ cm$^{-3}$ at approximately 20 nm deep from the surface.

In the embodiment of the present invention, the ion implantation energy of In and B are determined where the peak of the active impurity concentrations are located at approximately 20 nm deep from the surface of the semiconductor substrate 10. However, the peak location of the activity impurities concentration can be provided optionally by appropriately setting the ion implantation energy. In addition, in the embodiment of the present invention, the ion implantation peak concentrations of In and B are set at the same level. However, because it is an essential attribute that the B concentration corresponding to the desired activity impurities concentration is included in a region increasing the activity of the In concentration, the ion implantation peak position of each can be set optionally. In addition, the peak concentration can be set to the optional concentration by adjusting the dose of the impurity atom.

According to the embodiment of the present invention, the In and B impurity atoms may become electrically active by arranging In and B in the nearest neighbor substitutional site in the Si crystal. Furthermore, for decrease of energy by clustering between In and B, generation of the In—B cluster is enhanced, and the diffusion of In and B is suppressed.

Next a method to dope In and B in a source/drain region of a p-channel MOSFET is described by use of FIGS. 8A through 8F.

Figure 8A:
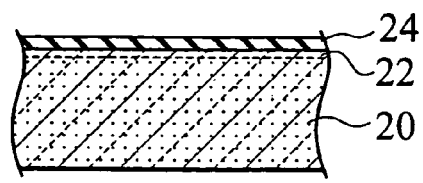
FIGS. 8A through 8F are process diagrams illustrating a manufacturing method of a semiconductor device according to the embodiment of the present invention.

(a) As shown in FIG. 8A, an oxide film 24 of 5 nm thick is formed by a thermal oxidation method on a surface of a semiconductor substrate 20 of an n type Si. Then, an impurity doping layer 22 doped with donor impurity atoms such as As and P as a 20 nm deep channel region is formed by ion implantation.

Figure 8B:
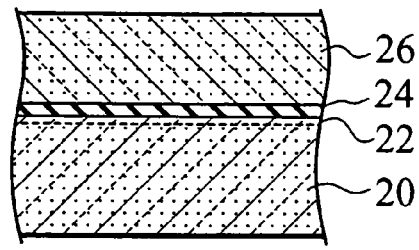

(b) On the oxide film 24, as shown in FIG. 8B, a conductive poly-silicon film 26 is deposited.

Figure 8C:
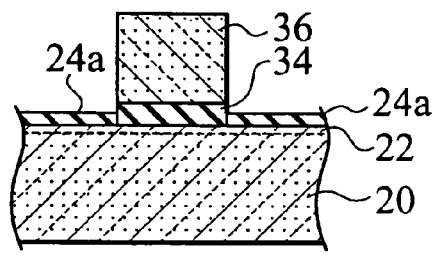

(c) By using a photolithography technique, as shown in FIG. 8C, the poly-silicon film 26 is processed to form a gate electrode 36. Then the oxide film 24 beneath the gate electrode 36 is formed as a gate oxide film 34 with the same thickness of 5 nm. For the region apart from the gate electrode 36, the oxide film 24 is formed as a thinner oxide film 24a by a gate electrode formation process.

Figure 8D:
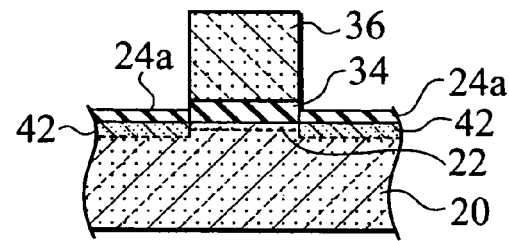

(d) In the semiconductor substrate 20, each of the impurity atoms of In and B is ion-implanted sequentially with peak impurity concentrations of approximately $1*10^{19}$ cm$^{-3}$, and peak positions of approximately 30 nm deep. By an annealing process, as shown in FIG. 8D, an extension diffusion layer 42 is formed. Here, In and B are not implanted into the impurity doping layer 22 beneath the gate oxide film 34 so that the gate electrode 36 works as a mask of the ion implantation.

Figure 8E:
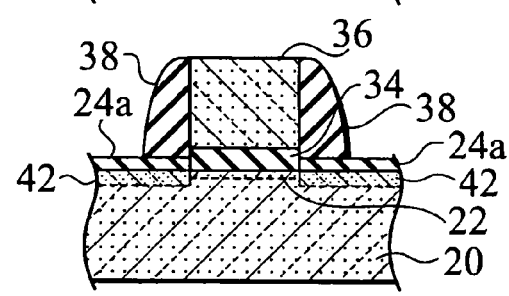

(e) Subsequently, a thick oxide film is deposited by a chemical vapor deposition (CVD) method or the like. By directional etching, such as reactive ion etching, as shown in FIG. 8E, a side wall insulating film 38 is formed in a side wall of the gate electrode 36.

Figure 8F:
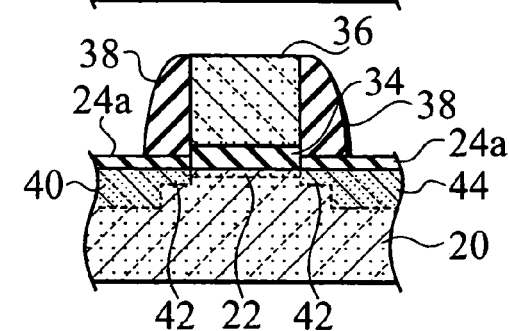

(f) Then, In and B are ion-implanted using the gate electrode 36 and the side wall insulating film 38 as a mask. By an annealing process, as shown in FIG. 8F, a source/drain diffusion layer 44 is formed. Each of the impurity atoms of In and B is ion-implanted sequentially with peak impurity concentrations of approximately $1*10^{20}$ cm$^{-3}$, and peak positions of approximately 100 nm deep. The impurity doping layer 22 beneath the gate electrode 36 and the extension diffusion layer 42 beneath the side wall insulating film 38 are masked by the gate electrode 36 and the side wall insulating film 38, so as not to be affected by formation of the source/drain diffusion layer 44.

As mentioned above, by the interaction of In and B, the active concentration of In increases. Furthermore, since the diffusion of In and B is suppressed, the extension diffusion layer 42 and the source/drain diffusion layer 44 may be formed in a desired region with a desired active impurity concentration.

OTHER EMBODIMENTS

The present invention has been described as mentioned above. However the descriptions and drawings that constitute a portion of this disclosure should not be perceived as limiting this invention. Various alternative embodiments and operational techniques will become clear to persons skilled in the art from this disclosure.

For example, after doping In and B in a Si substrate using ion implantation and the like, a Si epitaxial growth layer may be grown on the Si substrate surface so as to form the SSRP which has a lower surface impurity concentration. Additionally, it is permissible that, before the epitaxial growth on a Si substrate, either of In or B is ion-implanted first, and after the epitaxial growth of the Si layer, the other is ion-implanted. In addition, after doping either In or B, or both in a Si substrate, a portion of the Si substrate is etched and then the epitaxial growth of the Si layer is conducted so as to form the SSRP having a great impurity concentration-difference.

In addition, in the embodiment of the present invention, the Si crystal doped with In and B has been described. However, any atom having a small or large covalent bond radius compared with the covalent bond radius of Si, is at least a dopant for Si, and the dopant atom and other atom are inactive in the nearest neighbor lattice site location. Then, the same effect as the embodiment of the present invention is provided. Furthermore, instead of Si, for example, for a column IV semiconductor such as Ge, a SiGe system, a SiGeC system, a column III-V compound semiconductor such as gallium arsenide (GaAs), aluminum nitride (AlN), gallium nitride (GaN), indium gallium nitride (In$_x$Ga$_{1-x}$N), a column II-VI compound semiconductor such as zinc oxide (ZnO), zinc sulfide (ZnS), and the like, when dopant atoms have the same magnitude relation as Si with a covalent bond radius of a constituent atom of the semiconductor and are also inactive in the nearest neighbor substitutional site, then the same effect as the embodiment of the present invention is provided. In particular, in a diamond crystal, a combination of P as the first impurity atom and nitrogen (N) as the second impurity atom is desirable. In addition, in a GaN crystal, a combination of beryllium (Be) as the first impurity atom and C as the second impurity atom is desirable.

What is claimed is:

1. A manufacturing method of a semiconductor device, comprising:
   providing a semiconductor substrate;
   doping a first impurity atom having a covalent bond radius larger than a minimum radius of a covalent bond of a semiconductor constituent atom of a semiconductor layer of the semiconductor substrate; and
   doping a second impurity atom having a covalent bond radius smaller than a maximum radius of a covalent bond of the semiconductor constituent atom so as to be arranged in a nearest neighbor lattice site of the first impurity atom.

2. The manufacturing method of claim 1, wherein at least one of the first and second impurity atoms is an acceptor or a donor for the semiconductor layer.

3. The manufacturing method of claim 2, wherein a doping concentration of one of the first and second impurity atoms is equal to or larger than an electrically active impurity concentration specific to the one of the first and second impurity atoms.

4. The manufacturing method of claim 2, wherein the first and second impurity atoms are doped into the semiconductor layer by ion implantation.

5. The manufacturing method of claim 1, wherein a doping concentration of one of the first and second impurity atoms is equal to or larger than an electrically active impurity concentration specific to the one of the first and second impurity atoms.

6. The manufacturing method of claim 5, wherein the first and second impurity atoms are doped into the semiconductor layer by ion implantation.

7. The manufacturing method of claim 1, wherein the first and second impurity atoms are doped into the semiconductor layer by using an ion implantation.

* * * * *